US 6,515,346 B1

(12) United States Patent
Kemeny

(10) Patent No.: US 6,515,346 B1
(45) Date of Patent: Feb. 4, 2003

(54) MICROBAR AND METHOD OF ITS MAKING

(76) Inventor: Zoltan A. Kemeny, 1809 E. La Vieve Ln., Tempe, AZ (US) 85284

( * ) Notice: Subject to any disclaimer, the term of this patent is extended or adjusted under 35 U.S.C. 154(b) by 0 days.

(21) Appl. No.: 10/032,490

(22) Filed: Jan. 2, 2002

(51) Int. Cl.⁷ .......................... H01L 29/06; H01L 23/02
(52) U.S. Cl. ........................................ 257/618; 257/678
(58) Field of Search ................................. 257/618, 678

(56) References Cited

U.S. PATENT DOCUMENTS

| | | | | |
|---|---|---|---|---|
| 4,885,615 A | * | 12/1989 | Warner, Jr. et al. | |
| 5,032,896 A | * | 7/1991 | Little et al. | |
| 6,034,882 A | * | 3/2000 | Johnson et al. | 365/103 |
| 6,054,183 A | * | 4/2000 | Zimmer et al. | 427/249.8 |
| 6,185,122 B1 | * | 2/2001 | Johnson et al. | 395/13 |
| 6,278,050 B1 | * | 8/2001 | Urano et al. | 136/201 |

* cited by examiner

Primary Examiner—Ngân V. Ngô

(57) ABSTRACT

A bar or pipe shape semiconductor-integrated-circuit ("microbar") and method for manufacturing the same. The microbar is substitute for common flat microchip. The shape and size of said microbar calls for novel manufacturing processes in special lathe, holding its clean microenvironment. Also for Bar Level Packaging (BLP) with lead array over the cylindrical surface separated by insulator layer from the IC. Said array is either solder bump or ring. Inductive coil and common or fractal RF antenna are optional parts of said IC, which may be assisted by ferrite inserts in hole or counter bore at the microbar's end. Said insert creates extremely small and strong magnets or resonators on demand. Additionally micro machines (MEMS), optical wave-guides and switches, micro-loudspeaker or microphone and other electronic devices may be inserted into said hole or bore. Said microbar is mounted in single or multiple hole sockets of commercial grade or military grade (explosive shock resistant) boards. Said sockets are split lead only microbars. Segmental of said split microbar is spring loaded. Transfer socket allows inserting a microbar into standard microchip packaging for backward compatibility. The microbar IC can be photonic to serve as modulators, filters, routers or laser beam computers. Photonic and electronic IC combination is also disclosed.

64 Claims, 12 Drawing Sheets

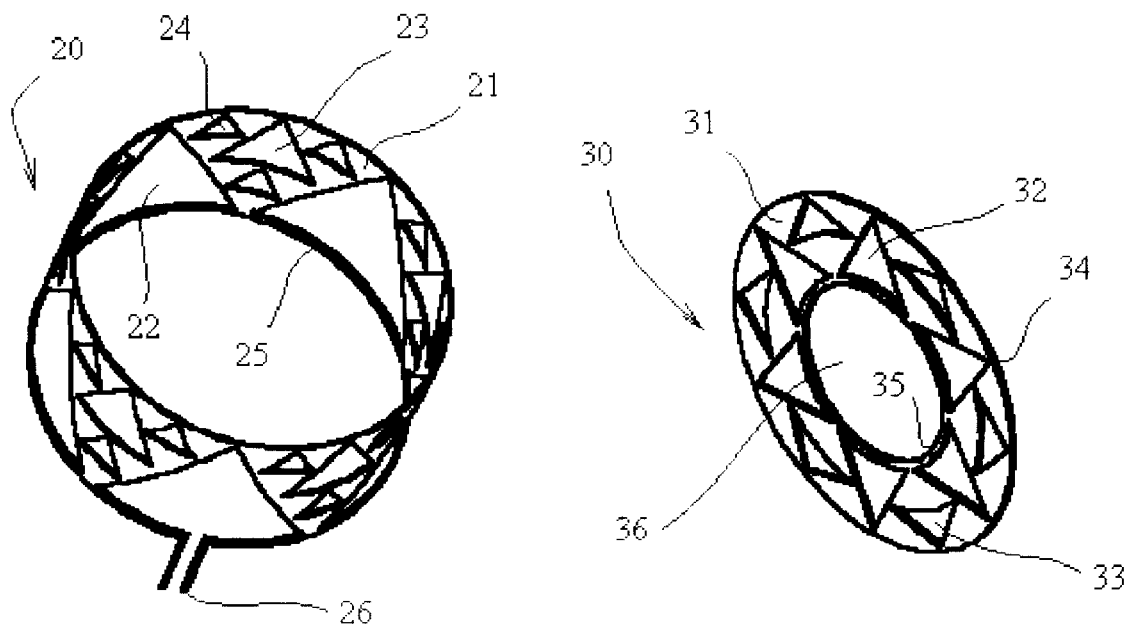
FIG. 2
FIG. 3
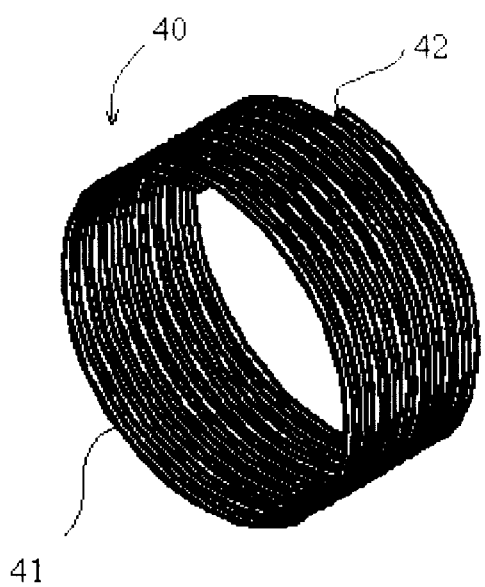
FIG. 4

MICROBAR AND METHOD OF ITS MAKING

RELATED FIELD OF APPLICATION

This invention relates to microchips, common inside computers and microprocessors. More specifically, to integrate electronic and photonic circuits built on the surface on semi-conducting material, such as silicon. Further more to such devices of other than flat shape, such as a rectangular thin plate. Even more specifically to cylindrical bar or pipe shape. Also to such electronic circuits having high inductance elements, such as coils and antennas. Finally, to such microchips of three-dimensional built circuits, including memory blocks, transistors, diodes, inductors, and capacitors, resonators, modulators, filters, gates, switches and lasers.

BACKGROUND OF THE INVENTION

Currently, electronic integrated circuits (IC) are built in a large array onto the surface of a large size (8" diameter, $\frac{1}{16}$" thick) semiconductor disk, such as a silicon wafer, which is sliced from large single crystal ingot. Then said disk is cut to produce about a hundred Very Large Scale Integration (VLSI) microchips of about $\frac{1}{2}$"×$\frac{5}{8}$" size dies, which are further processed by soldering electrodes (leads) and adding cover material and plastic housing (packaging) to form microchips. Said microchip work inside computers, cellphones, sensors, controllers and microprocessors to name a few applications. Smaller size wafers and dies are also common. Currently, the largest non-experimental wafer size is 12" diameter.

Said current embodiment—the die—perhaps small, in one dimension, relatively large in the other dimensions and require very large manufacturing facilities with clean machinery and processes in clean rooms, as well as an army of clean dressed personnel. Said process makes current microchips rather expensive (over a thousand USD per square inches). Today, the VLSI circuit density is reaching its physical limit at ever-increasing relative cost, although at slowly decreasing absolute expense. That means that said chip-making technology itself is reaching its economical limit as well. The burden of switching to 12" wafer technology industry-wide, appears to overwhelm any individual microchip maker. One reason of reaching that technological limit is that although said IC contains several layers of intermittent or patterned metal oxide, insulator, conductor and semiconductor parts, basically, all these layers add up to a coating size, so the microchip is by all means a two dimensional object. Thus to increase the density of said IC, there are to be used ever narrower conductors and insulating gaps between. Since said IC is printed by lithography and etching. The wavelength of the exposure light—currently roentgen or "deep" ultra violet (UV)—imposes limitation on the line width. Currently, the industry is down to 12–18 nanometer line width, which is the narrowest gap between two conductors in an IC. The smallest feature size currently is 50–100 nm. The deep x-ray limits that to 25 nm. Electron tunneling limits the line width to 3–5 nm. With the current accelerated microchip technology, the industry—insisting on Moor's law—expects to reach said limits within 15–20 years. One way out is to build IC vertically on the semiconductor substrate. U.S. Pat. Nos. 4,885,615, and 5,032, 896, 6,034,882 and 6,185,122 disclose such an attempt. Several of these proved to be very successful, because of advances in recent chemical-mechanical-polishing CMP and polysilicon deposition techniques, such as chemical-vapor-deposition CVD. Another new technique may contribute to 3D architecture. That is the surface monolayer initiated polymerization (SMIP), which is slow and rough today due to lack of surface tension and quick local heating and cooling capability. The microbar is just the ideal substrate for SMIP.

An objective of this invention is, not to expand said physical limit, but rather the economical one. That is to make comparable, equal or better quality microchips of about the same or achievable much smaller overall dimensions; yet marketable for only a few USD per square inches. Furthermore, to produce it in much larger (ten, hundred or thousand times larger) quantity, than it is produced today, and to produce much rapidly. That is, from crystal growth to packaging within one week, rather than half a year. Finally, to produce it without the need for any clean room operation with a single, alas large automatic tool group, holding its own microclimate. That is to produce said novel chips without direct human intervention and handling, except for tool startup, maintenance and shutdown or rebuild. Optionally, to produce continuously, without any shut down. The new manufacturing plant needs to be just a small fraction of current facility size. Such plant's environmental impact shall be marginal, shall utilize virtually all raw materials and shall consume rather small energy. The tool is to be designed and built in modules with standardized interfaces. Said modules are to be interchangeable and preferably made by different manufacturers. The emphasis of said new microchip making shifts from manpower to brainpower. That is from the daily plant operation, requiring many trained technicians to the tool and chip architecture design, requiring a few good engineers and scientists.

Another objective of this invention is to enable the integration of additional circuit elements, which require large scale coiling or closed fractal or loop antenna to add sizeable inductance or radio frequency (RF) power respectively. Du to the basic two dimensionality of current microchips, such elements are not used today. The basic bar geometry, i.e., three dimensionality of the microbar proposed here, allows the application of said elements new to Complementary Metal Oxide Semiconductor (CMOS) Integrated Circuits. Further objective is that the addition of said new elements are not to restrain the open dimensionality—at least in one (axial) direction—of the IC design to allow for size increase as integration level grows. Further more to allow for new IC design of closed loop in one (circumferential or tangential) dimension. Said closed loop IC would result in folding or turning around a flat rectangular IC to join its opposite edges, for instance wrapping it around a cylindrical surface. While left flat, such circuit closing can be achieved by wire connecting said opposite edges in the IC plain on a 2D microchip. Such flat circuit closing however consumes rather sizable chip area available for IC building and does not add inductance. One may observe that said new inductance and antenna elements could be printed on a Ball Semiconductor, manufactured by Ball Semiconductor Inc. in Texas as disclosed by U.S. Pat. No. 6,069,682 and a handful of other patents. This may be called microball, rather than a microchip. However, a microball IC designer can not increase IC size without increasing the microball diameter itself Said increase however has its natural limits. For instance, it is economical to make 1 mm diameter silicon balls by wafting but virtually impossible to make a 6 mm diameter one by other than machining, except in a space station plant, which is under no influence of gravity.

The proposed microbar has a definite advantage over a ball for being open axially. That is, a silicon bar can be processed (sized and polished) in CNC lathe and cut to different lengths to form the base material still as a single crystal for microbar manufacturing, again by special lathe processing. Further objective therefore to simplify IC manufacturing by using said lathe, for instance, using scanning laser lithography targeting the cylindrical surface of a rotating silicon round bar, rather than die image printing on a stationary substrate. Similarly all other processes common in microchip making is to be modified to lathe process. Said modifications shall represent no difficulty for the skilled in machine design and art. Said lathe shall hold its own clean microclimate, eliminating the need for clean rooms. Although said new lathe operation works on a single microbar at the time, said altered operations would be much faster than the corresponding microchip making processes, thus the fab throughput would be higher even for singe chuck lathe production. Said new processes would waste less material and consumables and would not require heating the entire silicon bar, but only a small spot on its surface at the time. Hollow or pipe-shape microbars could be cooled while processed in said lathe either by inert gas or liquid. That would allow by laser burning in rather than slot (masked) lithography. Since low temperature annealing body heating would still be needed, a longer microbar would require spindle support in said lathe. Said spindle supports as rollers may serve as heat sinks by roller cooling. One desired way to ensure continuity of microbar production is to make the tool holders redundant in said lathe. For instance, said lathe would have two—rather than one—polishing tool holder, each ready to use and being used alternating (or one standing by) until one of them have some problem, when the other one would operate and the bad tool is being replaced. CMP, bumping, CVD, sputtering, doping and all other tools and tool holders would be similarly redundant or reconfigured and greatly simplified. Robotics would move in and out said tool holders as needed and switch lathes if required for microclimate change or for queuing processes.

Note that said microball is not instructive—expressively or intuitively—to proposed microbar. A microbar could be of any rotational shape, conical, semi-spherical, but also prismatic, such as square, hexagonal, octagonal and other bar shapes or their combination. The IC making on a hexagonal silicon bar however would be closer to microchip making in pieces in a specialized mill, rather than lathe machine. That is projected die lithography would be better suited for prismatic bars, and scanning laser lithography would be better suited for round bars of silicon, germanium or other semiconductor materials.

An other objective yet, to enable and ease Wafer Level Packaging (WLP) of proposed 3D microchip, called microbar, which would be better called Bar Level Packaging (BLP) to be the rule, rather than the exception. Yet conventional leads, wire bonding and packaging would be reserved as an option. Note that it is much easier to design and make gripping sleeve sockets with electrical contacts as opposed to flat pressing sockets, which impose too much bending stresses on a microchip. A microbar is not sensitive to any pressure, circular or axial one. Said BLP thus enable a further 3 to 9 fold reduction in handheld microelectronic devices, such as cell phones and GPS navigators, to name a few. Said microbar is readily pressure held, for instance, spring loaded or snap latched in military electronics, thereby ensuring their high shock and vibration resistance. Thus a microbar would enable control and guidance electronics to be built directly into explosive triggering weaponry and other new shock demanding applications. Said microball patent has a long list of microball over microchip advantages, which are also applicable to microbar. Microbars may need to have orientation marks for proper aligning in socket. Said socket may have single or multiple holes to receive or bread microbars. On a microbar surface, as a BLP, contact or solder rings or segmental may substitute solder bumps over the IC, separated by insulator layer or off IC area. The matching socket may be made by the same technique as microbars themselves. For instance, said socket may just be a split, spring-loaded microbar of a larger size. Such microbar packaging and socket allows for orderly more effective utilization of an integrated chip circuit and printed circuit board "real estate". By another accounting, the current price of such an IC real estate is $1 billion and that of a board $1 million per acre. These prices would be reduced approximately to $5 million and $50 thousand respectively by using microbar, rather than microchip. Note, however that such "estates" measures in square inches, not in acres.

Another objective of this invention is to optionally utilize not only the cylindrical surface of a microbar for IC building, but at lest one end face as well, if that is necessary for function or for even smaller size. For instance, said RF antenna may be etched to said face and ferrite core may be inserted to said end counter bore or through hole to increase magnetic flux of said coils integrated into said shell IC. Micro-Electro-Mechanical Systems (MEMS or micromachines) may also be built to said end bore or hole. Also Optical Micro Machines (OMM), Micro-Electro-Mechanical-Optical Systems (MEMOS) such as Thermo-optic Switch, Liquid-Crystal Switch, Nonlinear Optical Switch (or optical transistors), laser or photonic wave-guides, Integrated Photonic Circuits (IPC), bubble micro optics, loudspeakers, microphones and other miniature electronic or electromechanical devices or components. MEM pump and control valve can be built into the hollow core of a microbar, which can operate as a heat pump to provide high efficiency cooling using micro-fluidics. That speeds up computation or sensor reaction and extend microbar lifetime in operation. Said hollow core may contain comparator (gauge) liquid or gas or biological agents in micro-sensors. Said through hole may be used as a sampler tube for particle counter micro-sensors or trace element detectors. Finally, IC may be built onto the inner surface of said bore or hole. Said through hole however is better utilized as spindle or chuck extensions in said lathe for rigidly holding said microbar in manufacturing, especially when its through heating approaching melting temperature is unavoidable for some processes. A spring loaded or pneumatic through bar with end button or inner chuck may be used for microbar holding if necessary. Thus, micro sensors, photonic routers and computers, RF transmitters and receivers, circular piezo actuators and flow controllers and a host of new functions are enabled by microbars, which are not practical or possible to make on microchips.

Recent advances in CNC lathe and mill technology and in micro positioning, allow us to step off the realm of microchip two dimensionality (2D) to microbar three dimensionality (3D), making some common fab processes, such as wafer CMP (Chemical Mechanical Polishing) obsolete in its current form. Such processes—due to induced vibration, capable to brake wafers frequently—appear to be the major obstacle in the road to switch from 200 mm to 300 mm wafer technology today. The microbar is especially suitable for 3D IC architecture, because any external layer is longer than any internal one, thus slightly opening up outward, in which direction, feature errors tend to accumulate naturally.

Furthermore, because CVD polysilicon layers crystallize in large oriented grain due to the engineered balance of surface tension from cooling and centrifugal forces from spinning as physics allow. That enables making microbars of extremely large (terabyte) storage memory; of miniature size extremely strong magnets; of powerful micro electric motors and RF antennas and other devices unattainable before.

BRIEF DESCRIPTION OF THE DRAWINGS

FIG. 2 illustrates a cylindrical fractal RF antenna, an IC component on a microbar's cylindrical surface.

FIG. 3 illustrates a flat fractal RF antenna, another IC component on a microbar's end face.

FIG. 4 illustrates an electromagnetic coil, yet another IC component on a microbar.

DETAILED DESCRIPTION OF PREFERRED EMBODIMENTS

Figure 1:
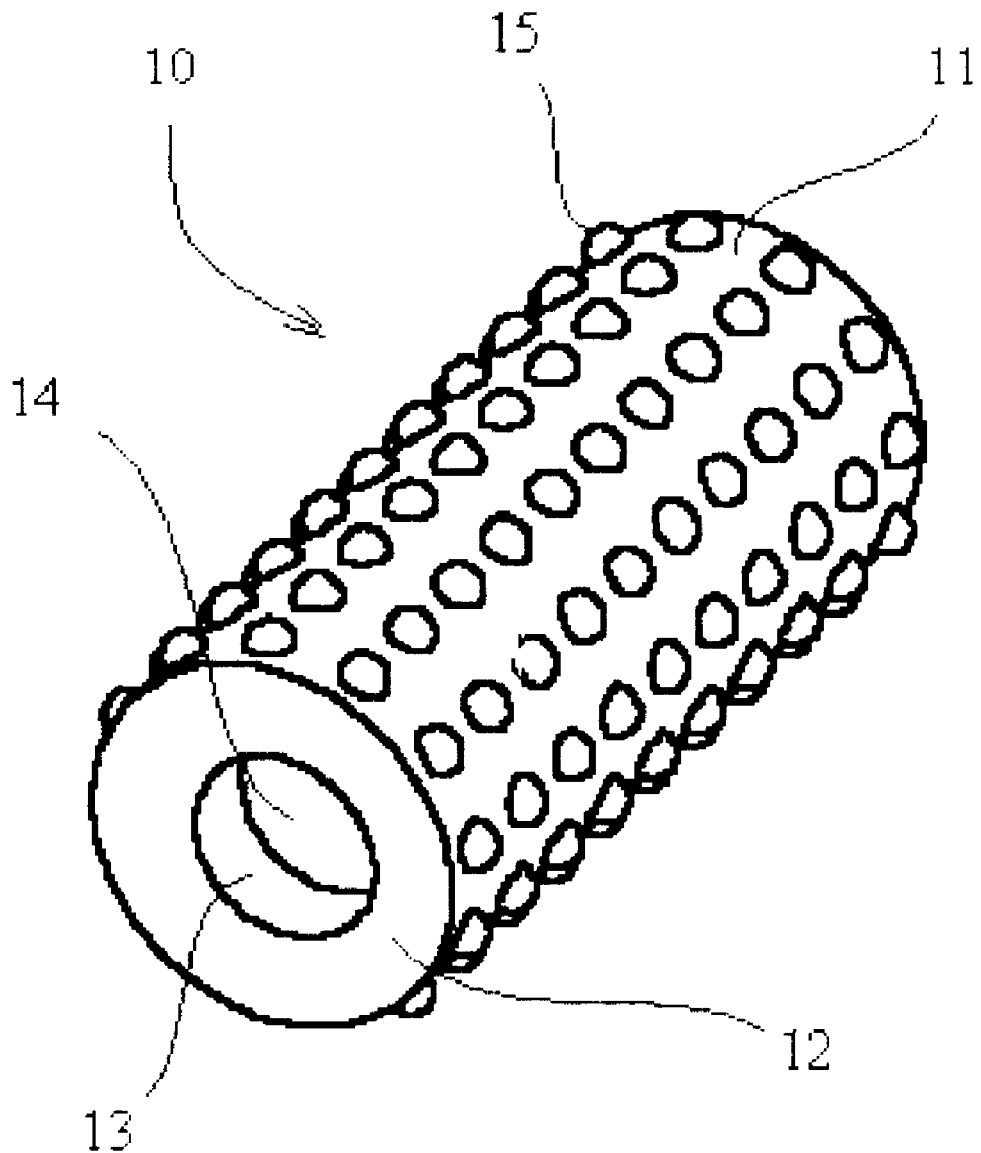
FIG. 1 illustrates a microbar with solder bump leads, a preferred embodiment. It is about 4 mm diameter and 10 mm long with 120 solder ball leads (I/O contacts) of 0.5 mm diameter in a 30° (or 1 mm)×1 mm array on the cylindrical surface, right over the IC, separated by insulator layers (BLP). Microbars would vary in size from about 1 mm to 10 mm diameter and length of about 1 mm to 25 mm. It also has a counter bore in one end for spindle contact and optional ferrite insert to increase magnetic flux in the coiled IC part around the counter bore. Said size would replace a 12 mm×10 mm (unpackaged size) VLSI microchip, say an Intel Pentium III. Microprocessor used in computers.

FIG. 1 illustrates a microbar 10 with leads 15 as I/O (Input-Output) contacts in linear-circular array on the cylindrical surface 11 as a preferred embodiment. Face 12 is counter bored. Bore wall 13 and face 14 is also available for IC building.

Microbar 10 is preferable manufactured from a single crystal silicone, germanium, gallium-arsenid or other material suitable for semiconductor electronic IC building on its surface by known methods (doping, etching, sputtering, CVD, epitaxy, MBE, CMP, etc.). Some of said known methods are to be modified, however, to better suite and take advantage of lathe technology. For instance, UV (ultraviolet) die projection lithography may have to be substituted by scanning laser lithography or slot projection lithography. Microbar 10 is about 10 mm long and its diameter is about 4 mm. Its unfolded cylindrical side is 12.56 mm×10 mm about the same as the die size of an Intel Pentium III 2000 VLSI microchip. Other sizes may be also practical from 1–10 mm diameter to 1–25 mm length. Microbar 10 may have an extension opposing face 12 for lathe chuck holding, which at the end of manufacturing may be cut off (not shown).

The counter bore in face 12 is suitable for MEMS, ferrite insertion or to receive other microelectronic devices, such as loudspeaker, microphone, heat sensor, pressure sensor, RF antenna, photonic circuit and battery to name a few (none is shown). Said counter bore is suitable for spindle holding, required for large length to diameter (aspect) ratio microbars. Both ends of bar 10 can be counter bored for double (tandem) spindle holding, eliminating chuck holding. Said counter bore may be substituted by through hole. Said hole may receive moving parts, such as vibrating rod sensors or actuators, as well as liquid or gas flow, to name a few (none is shown). Said fluid flow may be used to heat or cool the microbar as needed in manufacturing or after in use. Flat and ball shape microchips do not allow for such useful components an methods.

120 solder bumps (leads) 15 as I/O contacts are separated from said IC by insulator layer in a 30°×1 mm circular-linear array as part of the Bar Level Packaging (BLP) system. Said bumps are about ½ mm diameters and fall about 1 mm apart. (Photonic flip mirror lenses are about the same size and separation in photonic circuit). Larger size bumps in denser array would still be workable if more I/O terminal is required. Said bumps are used today on some WLP microchips to substitute pins of its packaging for overall size reduction. Said bumps may be built on face 12 or 14 and on wall 13. Said wall 13 need not be necessarily cylindrical, but rather conical, spherical or other shape. Sides 12, 13 and 14 are more suitable for photonic switch or transistor building than side 11, for instance, to make a fiber optic router. In said router the polished through bore surface 13 is suitable for transfer mirror (as a wave guide) and said lenses as OMMs are to be repeated on both ends of bar 10 (one for input and the other for output).

Part of said IC built on either sides 11, 12, 13 or 14 antennas, coils and other elements—new to microchip technology—in further figures, is proposed to build.

It shall be obvious that a microbar can be other than cylindrical shape. For instance, any shape of any contour line rotated around an axis would suffice. Also, that a triangular, square, pentagonal, hexagonal, etc. bar formed in mill, rather than in lathe, are valid embodiment, alas less practical. Such prismatic microbars could however accommodate with great ease current projection photolithographic technology. The round microbar is more practical for scanning lithography and polymerization. It shall be also obvious that a solid round or pipe microbar can be nested in a pipe microbar for enhanced functionality. Multiple nesting is also within the teaching of this invention.

FIG. 2 illustrates a fractal RF antenna 20, for instant an UHF receiver as a component of a TV set (less the screen) on a microbar. Antenna 20 is about 5 nm thick and is etched on surfaces 11 or 13. Metallic cylindrical wall 21 is broken by triangular $1^{st}$ level apertures 22, then by $2^{nd}$ level ones 23, then by $3^{rd}$ level ones 24 in a sequence. Said aperture sequence may continue to downsize to level N, where the size is approaching said thickness (not shown). The characteristic size S (not called out) is the base of said triangles, the largest of which defines the center band frequency of antenna 20. The transmission quality and bandwidth is a function of N and S as well of M, where M is the number of the largest size triangle in a loop. Noise level in said transmission is also the function of said parameters. S is close to the half wavelength of a RF signal (wave or wavelet), which is able to transmit or receive with the highest transmission power to lowest feed power. Ist level triangles may connect by "wires" 25, if the height of said triangles is just slightly less than antenna 20's length as a cylindrical body (as shown). Said wire 25 is broken at one point to form feed wires 26, which connect antenna 20 to the rest of said IC.

Said wall 21 can be made as a double wall structure, whereas the two metallic layers are to be separated by an insulator layer, for instant, a polymer (not shown). Said double wall antenna has high capacitance and edge flux, useful in RF circuits. Triple, quadruple and other multi-layered structures are also proposed.

Squares, circles or other shapes may substitute said triangles. Each of these has their own benefits and drawbacks. Once such a device is built as silicon optical wave-guide rather than a metal layer built to conduct electricity, a unique (phase shifting) photonic device of special purpose will result, which is also proposed. Cylindricity, however is not a unique requirement to make such devices as explained above and illustrated next. The reason for mixing electronic and optical components in IC is that silicon, for instance, has both excellent semi-conducting electrical and semi-translucent photonic properties, once properly enabled by doping and other techniques.

The following electronic IC elements or modules are known to the industry today: transistor, field-effect-transistors (FET), diodes and zeners, voltage-inverters (VE) inductors or coils, capacitors, resistors, conductors or leads and antennas or terminals and memory blocks (permanent and temporary). The following photonic IC elements or modules are also known to the industry: transistor, diode, wave-guide or coil, wave-splitter or prism, switch, collector and spreader lenses, polarizer, channel filter, modulator, coupler, and router. The following logical IC elements or modules are also known to the industry: inverter, blocker, gate and switches, adder or integrator and multiplier. Any surface of a microbar can accommodate any of the above known elements or modules in any combination. Techniques to form any such IC on semiconductor substrate are also known or common. For instant, a laser is a combination of electronic and photonic elements, forming a controlled module and inserted on silicon surface in either deep trench (side by side or 2D) or thin layer (one over the other or 3D) configuration. A photo diode is a similar example of such combinations. A random access memory (RAM) block is an example of electronic and logic IC combination.

FIG. 3 illustrates a flat fractal antenna 30 to be deposited on surface 12, but otherwise similar to antenna 20. Wall 31 is broken by $1^{st}$ level apertures 32, then by $2^{nd}$ level ones 33. This sequence is to be continued as explained above for antenna 20. Brakes and feed wires may be inserted at apexes 34. Wire 35 (corresponds to 25) not shown as broken for I/O. The fractal center 37 is to be mated with the cylinder centerline of bar 10. Antennas 20 and 30 need not be necessarily closed in a loop.

FIG. 4 illustrates an Electro-magnetic coil 40 to be deposited or etched on surface 11 or 13. Wire 41 is about 5 nm thick and terminates in ends 42 as I/O ports to be connected to said I/C. Once in said bore or hole in bar 10 having a coil 40, ferrite or other material, which enhances magnetic flux is inserted or moved, coil 40's inductance will be sizable. Said material may be laminated or dispersed or granular, in which insulators reduce hyisteresis (not shown) separate particles or parts. Said coil may be an optical wave-guide as well. Wire 41 may have opposing notches (not shown) in a row all along or other sub features useful to achieve special performance if necessary. Inductive spiral coil built on face 12 may also be practical. Said ferrite may also be used over surface 11 around coil 40 over surfaces 11 or 13. Fluid of magnetic material or suspension may also be flown through said center hole in bar 10. That might be of great use in micro fluidic controllers and sensors. For instant electr-orheological (ER) or magneto-rheological (MR) fluids may be sustained in suspension by resonator circuit built into said counter bore or hole end 13. An IC on face 12 may then control said ER or MR fluid viscosity by the speed of light.

Coil 40 may be formed as a multi-layered coil (not shown), either by turning back at the end of the cylinder or starting over at the beginning. The former results in a lattice coil, similar to a transformer or speaker coil, while the latter in a parallel coil. In the lattice coil, left- and right-handed coil layers are superimposed and thus, such coil has small capacitance. In the parallel-coupled coil, the axial reconnection wire requires an extra insulator layer. Double helix coils (not shown) require two. Such double wire coil has high inductance and capacitance, thus called resonator or band gap coils. Double coils are useful in miniature RF devices, such as hearing aids and cell phones. Currently, the smallest double wire coil can be made by using 5–10 atom diameter carbon nanotubes, called fullerene wires. These are excellent electrical conductors and ideal optical wave-guides, thus equally useful in electronic and photonic IC building. Said nanotubes may wind as grow from "bucky-nozle".

Coil 40 may also be formed by a series of wound, cross-connected rings or segments (not shown). Some microbars may contain coils only with or without magnetic or ferromagnetic metal or metal powder cores. A large array of such electromagnetic coils can form of an extremely thin and strong magnetic sheet of magnetism on demand. Said sheet can be glued onto any suitable surfaces. Said sheets may also be useful as the major component or electric motors (stator or rotor). A single such strong magnet coil is useful making single particle source gun or accelerator. Said particles may be atoms of lighter elements—for instant, helium—or parts of their nucleus, such as proton or neutron or other sub atomic particle, for instant meson. A single photon or electron source is similarly made and used in instruments for nuclear, chemical or biological agent detection or identification.

Figure 5:
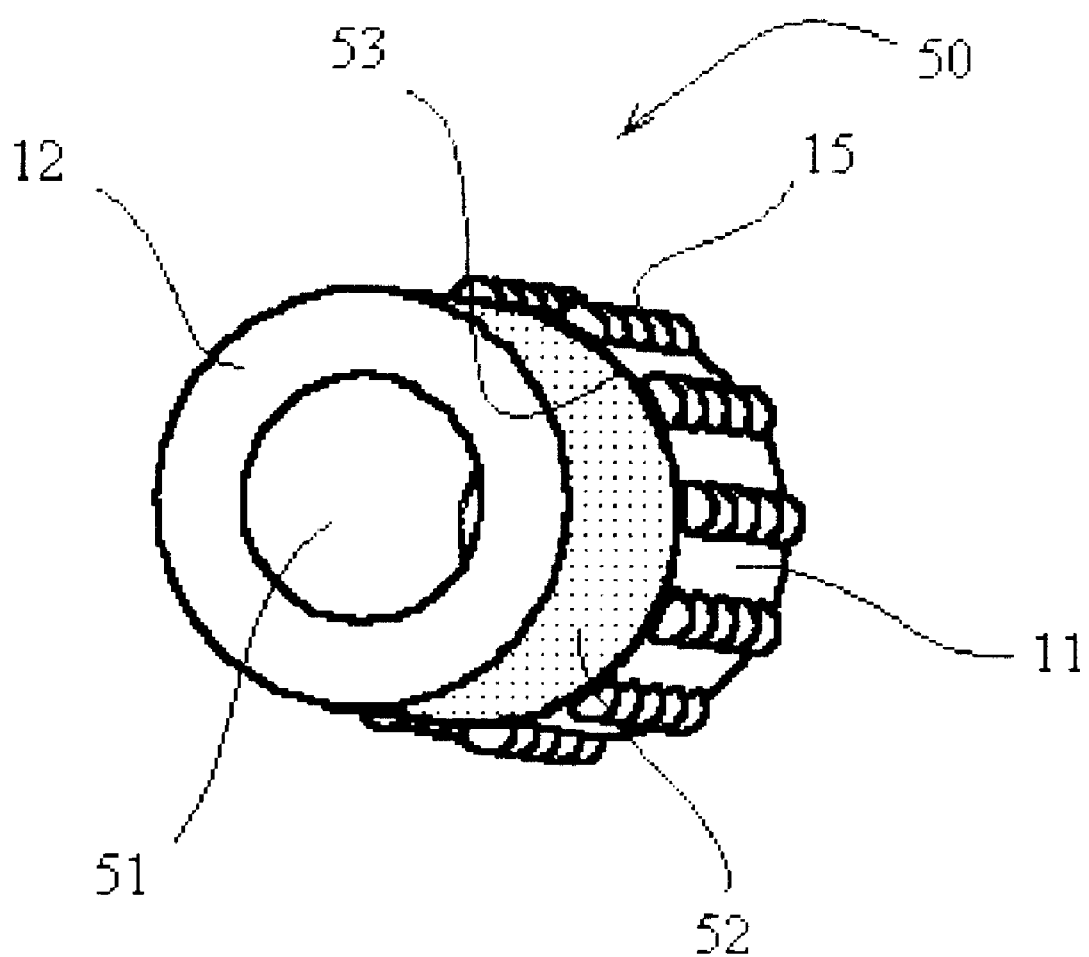
FIG. 5 illustrates a microbar with through hole and off-IC BLP. Otherwise, same as had shown in FIG. 1.

FIG. 5 illustrates a microbar 50 having a through hole 51 and an exposed IC surface 52, as well as a BLP end 53. This microbar is similar to microbar 10, having the same face 12, insulated surface 11 and solder bumps 15. Hole 51 is suitable for fluid or gas flow or for part insertion. This embodiment separates the IC area from the BLP one. Microbar 50 takes up the same area in the printed circuit board (PCB) than microbar 10. The off-IC packaging avoids quality control problems associated with insulator burn through, when packaging is done as shown in FIG. 1.

Figure 6:
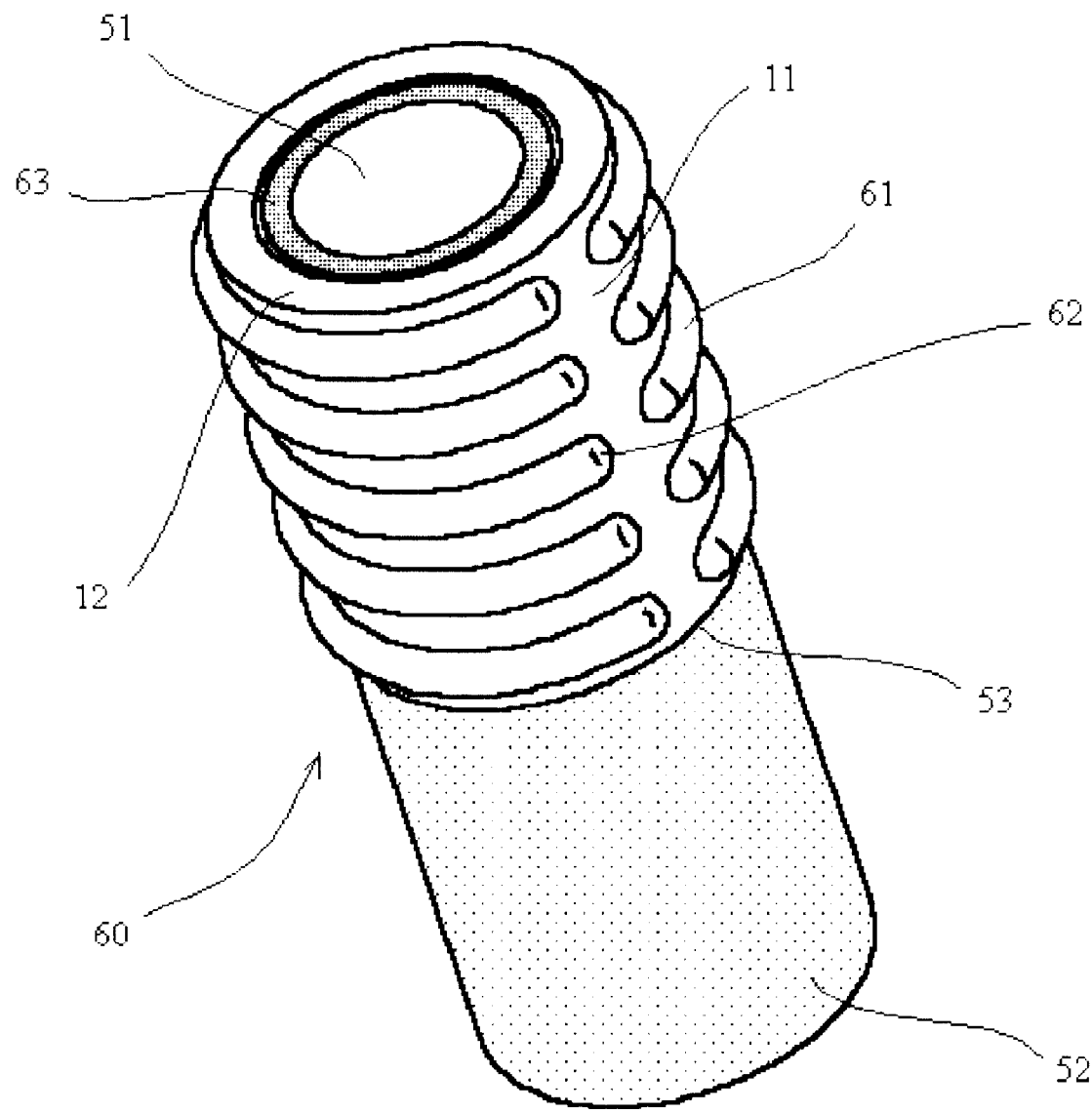
FIG. 6 illustrates a microbar with through hole, metal pipe core and segmental ring leads on off-IC area bar level packaging end. Otherwise, same as had shown in FIG. 5.

FIG. 6 illustrates a microbar 60 similar to 50. Instead of solder bumps, solder segmentals 61 are serving for I/O. Said segmental—180° shown—may be ring however (360°). Any other, shorter segmental—down to about 3°—considered practical. Segmentals terminate in terminal ends 62. Segmentals are more easily seated in sockets than solder bumps, but require larger packaging and socket. Feature size of said packaging elements are about the same as that of microbar 10. Exposed IC surface 52 and BLP end 53 with insulated surface 11 is the same for microbar 60 as for microbar 50.

Microbar 60 has a metallic pipe core 63, useful in fabrication. The silicon substrate—exposed only by its face 12—is either a singe crystal one or a multigrain epitaxy growth one or polysilicon. Said pipe 63 can be kept under axial tension in the lathe. Said lathe is to have at least two opposing chucks, holding a long pipe 63, which need to be supported between microbars by rollers. Epitaxy and other IC making process can be carried out repetitively between said rollers. Finally, individual microbars—for instance, microbar 60 or 50 or 10—can be cut off to individual pieces. One such pipe 63 may be as long to contain about 20 to 100 microbars and said lathe may have about 6 to 36 double chucks. Through hole 51 can be used to flow through coolant or heating liquid, while said rollers can transfer heat to pipe 63 during lathe processing.

Hole 51 may be plugged in and contain MEMS heat pump with closed in working fluid. Such MEMS may circulate said working fluid—for instance, sucking in at the center, pumping through a control valve and pumping back on the perimeter—to sweep heat away the silicon substrate towards a heat sink. Said heat sink shall be on the BLP end and may be just a larger metal part, with cooling ribs, as customary in PCB applications (not shown). The newest microrefrigerators can remove 200 watts per square millimeter while consuming only about one watt. That makes auto-self-cooling of microbars practical.

Although, BLP is show on one end of the microbar only, the double end BLP embodiment is instructive as well, and so is the double end cooling technique.

Figure 7:
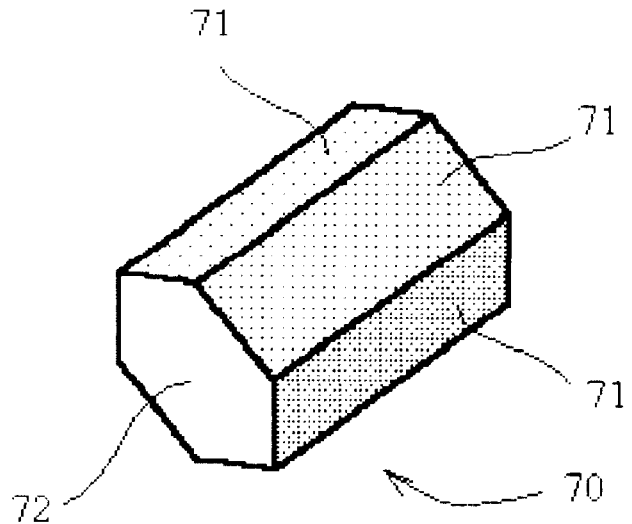
FIG. 7 illustrates a hex-microbar.

FIG. 7 illustrates a prismatic microbar 70, which is in particular a hex-bar. It is a single crystal part with six IC faces 71 and two untreated fend faces 72. BLP is not shown. Other than hexagonal shape embodiments shall be obvious. Prismatic microbars are rather milled than processed in lathe. Milling machines are inexpensive for this purpose. The flat sides allow for conventional photolithography, which facilitate technology transition from microchip to microbar. Yet the round microbar offers more advantages. Counter bores, through holes and other features explained before are applicable to any prismatic microbar embodiment.

Figure 8:
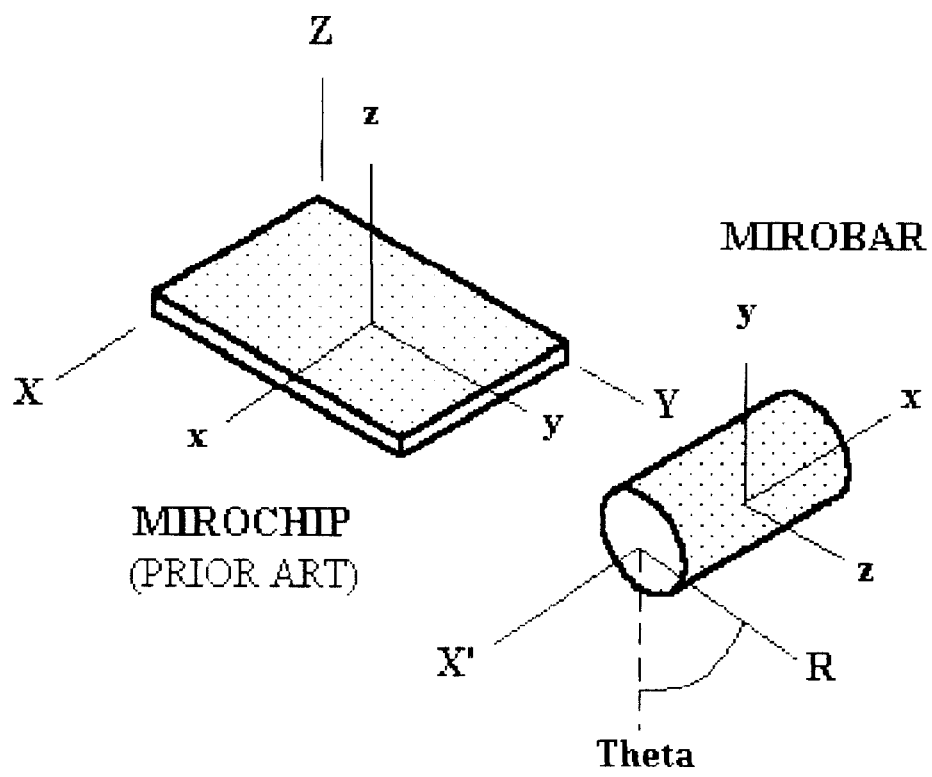
FIG. 8 illustrates the coordinate system convention for a microchip (prior art) and a microbar.

FIG. 8 illustrates the coordinate system convention for a microchip (prior art) and a microbar, both having equal IC surface (dotted shade). Both have a global and a local coordinate system assigned. The global planar coordinates of the microchip are X and Y, in which a 2-D IC is built. The third global coordinate, Z is the 3-D building direction. At any arbitrary point on the microchip's IC surface a local coordinate system, x, y and z is assigned. Said global and local coordinates—Cartesians—are parallel correspondingly. The corresponding 3-D dimension is R (radial) for the microbar. Axis X' is the microbar's rotational axis, which correspond to X. Theta measures the rotation angle from an arbitrary direction (dotted line). X', Theta and R is the global coordinates of the microbar. To any point on the microbar's IC surface, a local coordinate system—another Cartesian—can also be assigned. Note that x, y, and z on the microchip is to be parallel to X, Y, and Z correspondingly. Also that the two local coordinates (surface coordinates) are labeled identically, so the epitaxy layering direction is z in the prior art and in the proposed one. That avoids confusion in translating microchip art to microbar art. That is the out of plane or third or growth dimension is always z. The IC surface of the microchip and the microbar is shown to be equal in area and in one dimension. That illustrates comparative prior and proposed art sizes. Note also that y on the microbar is tangential to the revolution. In manufacturing, the microbar is turned around its X' axis in a lathe. Due to centrifugal forces, such a turned IC surface is subject to radial and tangential forces. The surface tension of a molten epitaxy layer works against such tangential forces (hoop tension). That allows unique crystal growth orientation control of polysilicon layers, which is not possible in microchip making. Polysilicon crystal grains on a microbar surface thus are more uniform and larger in size than a similar layer on a microchip surface. Furthermore, the outer side of any layer on the microbar is longer in direction y than that of on a microchip. Since contour errors add up as more layers are built up, 3-D IC building is far more convenient and reliable on the curved IC surface of a microbar than on the flat IC surface of a microchip.

Figure 9:
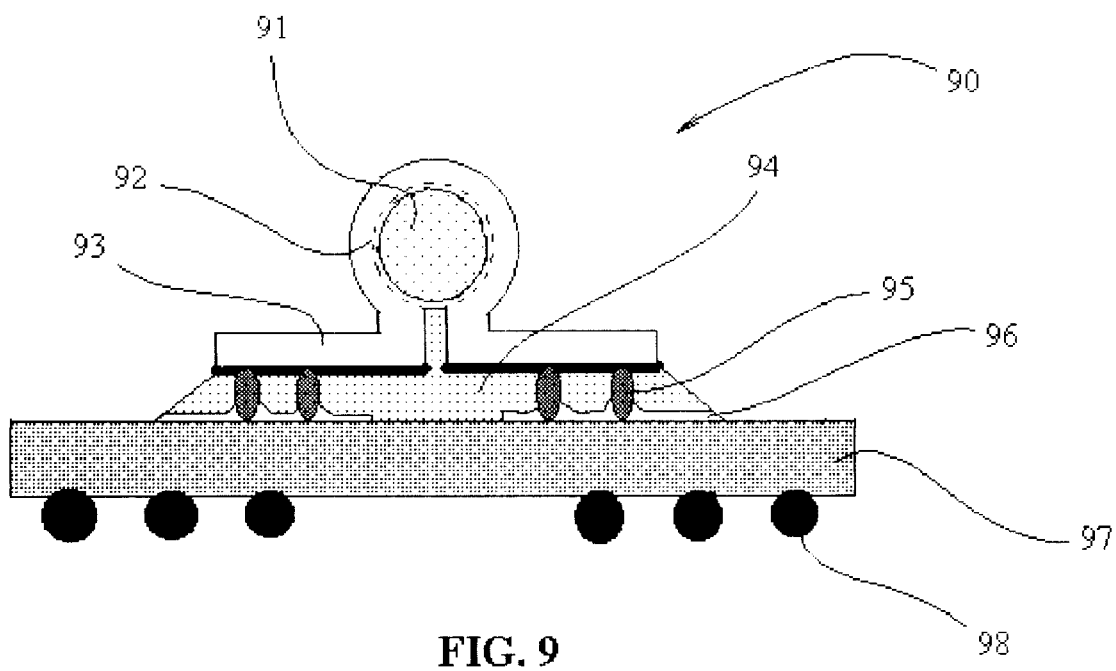
FIG. 9 illustrates diagramm atic cross section of a transfer packaging, which allows inserting a microbar into a standard Flip Chip (FC) socket currently used for microchips.

FIG. 9 illustrates by a diagrammatic cross section of standard Flip Chip in Chip Scale Package (FCCSP) to Ball Grid Array (BGA) transfer socket 90. The advantage of using such intermediate technique is that microbars could be readily accommodated by current PCB designs. The disadvantage is that it doubles the overall packaging height. However, in the z direction (see FIG. 8) the height is not limited by all means. For instance, said overall height will be about 1.6 mm for the smallest 5×5 mm$^2$, 20-ball count, 0.65 mm ball pitch FCCSP. The same for the largest 1012-ball count, 1 mm ball pitch FCCSP. Said packaging is to be tested for defects. Current testers are unable to measure $\mu$H range inductance on said packaged microchips. Due to the very high intensity inductance of the microbars, more reliable and convenient testing will become possible and practical.

Microbar 91 is bar level packaged either as microbar 10, 50 or 60 using bumps 15 or 61 and inserted into the interconnect 93 having matching contacts. Interconnect 93 is held down by under fill 94 onto electrodes 96 and substrate 97. Soldering bumps 95 connect as conductor inter-connect 93 and electrodes 96. The transfer socket passes control on I/O terminal solder balls 98. Interconnect 93 have layer-by-layer, simple one-to-one IC wiring. Under fill 94 is melted and cured after the metallic contacts were made. FIG. 9 also illustrates how small modifications of current chip making technology suffice to be ready for microbar making. Two other simple such modifications are the slot projection and the laser scanning lithography modified from current photo lithography, will be illustrated next.

Figure 10:
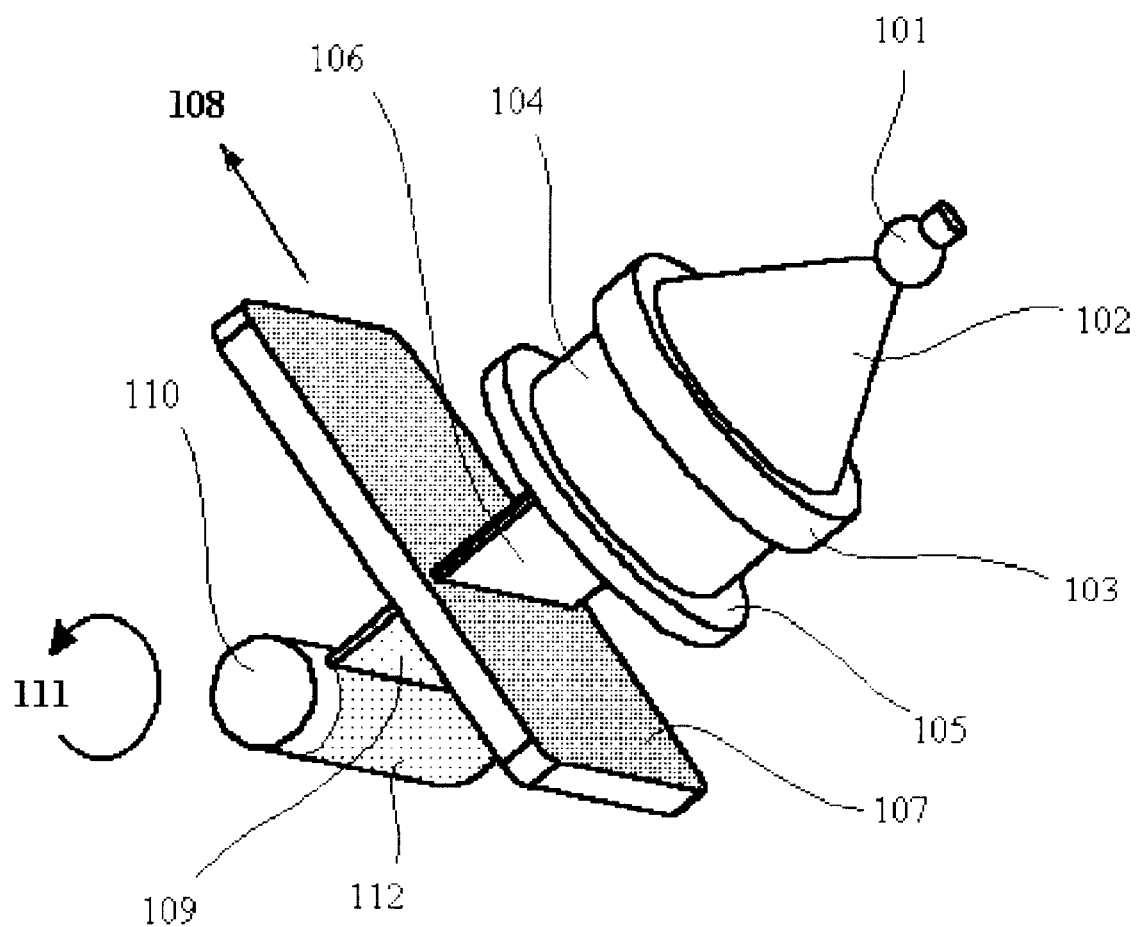
FIG. 10 illustrates the slot lithography process in schematic. The method is also representative to other slot processes such as CVD, doping, sputtering and ion implanting. Slot processes retain current masking techniques, alas modified.

FIG. 10 illustrates schematically a slot lithography process applied to microbars as modified from current projection lithography. Light source 101 emits suitable UV or x-ray light, which is collected by lens 103, which passes parallel beam 104. Beam 104 is passed through a slot formed in a dark medium 105. Said slot thus emits a narrow beam 106, which passes through mask 107, which is a conventional photo lithographic mask. Mask (reticle) 107 is translated (108) across beam 106. Mask 107 shadows some parts of beam 107, which thereby becomes the carrier or informative beam 109. Beam 109 hits the surface of microbar 110, which rotates (111) as needed to expose image 112 on the photo resist coating on microbar 110. Then microbar 110 is ready for etching. Except that the image is projected on a cylindrical rather than flat surface, this process is not much different from conventional photolithography. The speed of movement (108) and (111) as well as the slot width are to be well engineered and controlled. Said slot projection process coordinated with the turning of the microbar also representative to other common processes, which require mask projection. For instance, CVD, doping, sputtering and ion implanting can be done similarly. The advantage of turning slot projection lithography (TSPL) is that it retains all common mask. Its disadvantage is hidden in the difficulty of said motion coordination.

Figure 11:
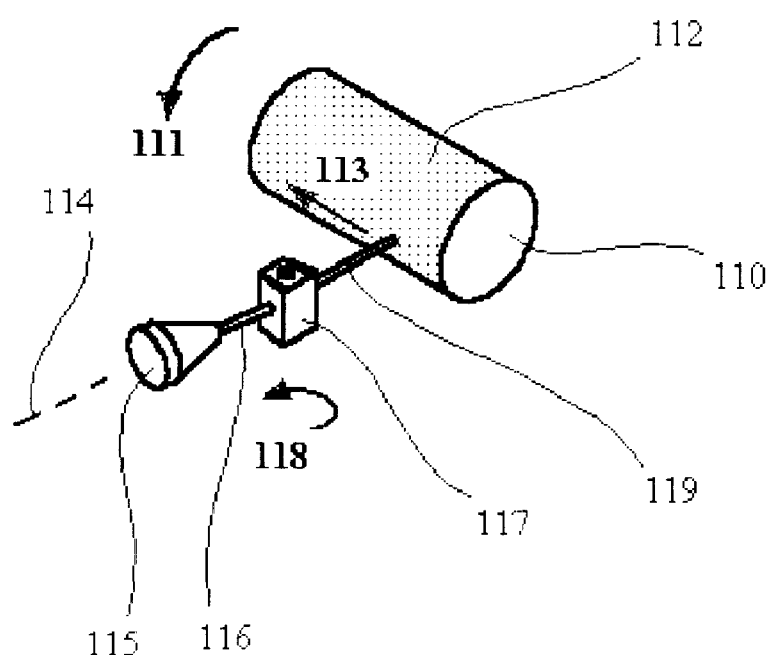
FIG. 11 illustrates the scanning lithography process in schematic. The scanning method is also representative to other processes such as CVD, doping, sputtering, epitaxy, etching, ion implanting and other processes. The scanning process is practical on microbars due to the special geometry and heat transfer conditions.

FIG. 11 illustrates the scanning lithography process in schematic as applied to microbar IC building. Microbar 110 is rotated (111) the same way as discussed above. The IC lithographic image 112 is formed by the axial scanning movement of laser beam 119, which is the information carrier beam. Said information 114 is received and converted to intermittent light by laser beam gun 115. Laser beam 116 leaves said gun 115 and diverted by prism or mirror or lens 117, which pivots (118) or rotates, thereby scanning surface 112 of microbar 110. The laser beam intensity and section, the said pivoting (118) and rotation (111) is computer controlled. Similar scanning image processors are used elsewhere, for instance in the bar code reader and in the desktop scanner in different scale and mode. The advantage of scanning lithography is its simplicity and economy as well as its small size. The disadvantage is that said scanning and other movement coordination requires extreme precision and coordination. Obviously, several other processes can utilize said scanning technique. CVD, doping, sputtering, epitaxy, etching, ion implanting, burning, curing and other processes allow process uniformization and standardization of IC building on microbar surfaces. Scanning IC forming is completely digitized thus can reach production from design virtually instantaneously.

Figure 12:
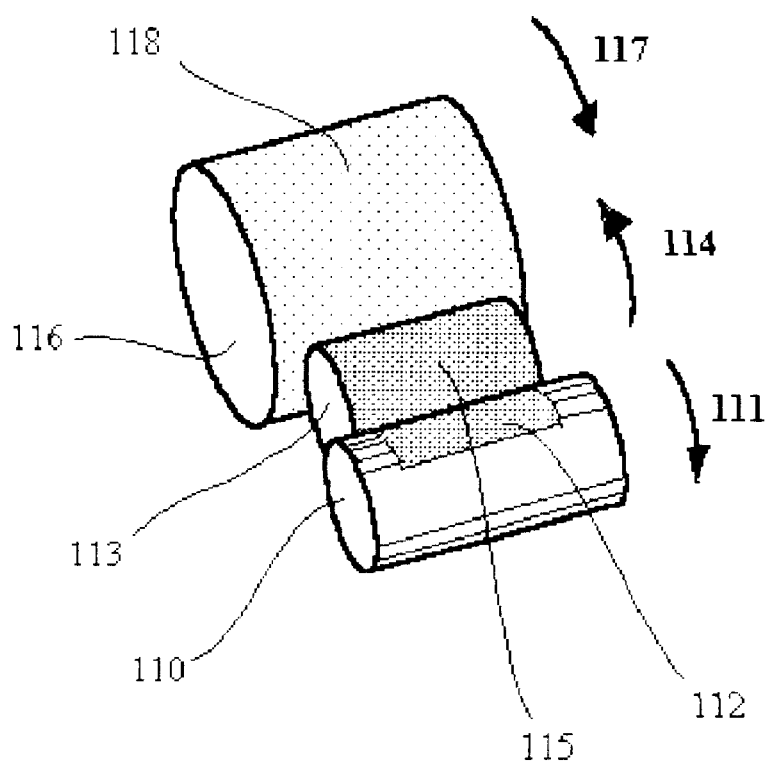
FIG. 12 illustrates stamping lithography process schematically.

FIG. 12 illustrates stamping lithography in schematic as applied to IC building on the cylindrical surface of a microchip. Some manufacturer for its simplicity and economy to make microchips today uses flat stamping. The disadvantage of its application to microbar lies in the difficulty in image closing and in contact-pressure maintenance. That is the difficulty of matching the starting and closing lines of the printed image. When round IC design is a mere copy of a flat one, such closing is not needed. Rolling stamping lithography of microbars is extremely cheap and robust.

Microbar 110 rolls (111) in contact with roller stamp 113 from which it receives its printed image 112 in ink. Thus stamp 113, which rolls (114) is to have the same diameter as microbar 110. Rolling (111) and (114) are equal and opposite. Stamp 113 is produced before sad roll stamping by standard flat or slot or scanning lithography as a negative image made on the surface of an elastomeric layer. The ink is applied on roller 113 by roller 116, which have its surface 118 wiped or brushed (not shown), to avoid excess ink thickness. Etching thereafter will remove portions of image 112 not darken by ink.

Figure 13:
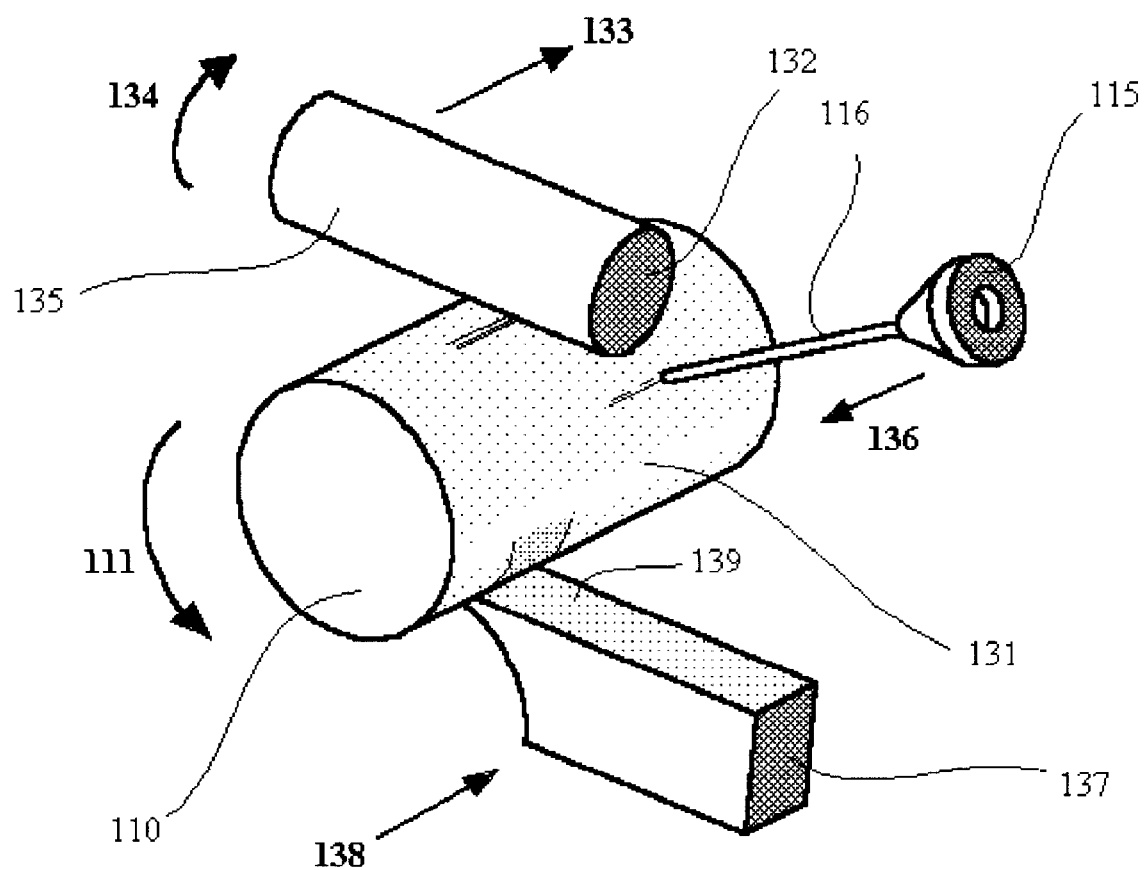
FIG. 13 illustrates a general lathe process schematically as applied to microbar making.

FIG. 13 illustrates the lathe process in schematic as applied to microbar manufacturing. This is representative to several processes, including CMP, lathe-milling, etching, CVD, doping, ion implanting, sputtering, polymeric curing, baking, external cooling, slurring, washing, cleaning and reference imaging, testing and probing by scanning.

Microbar 110 turns (111) in contact with tools 132 and 137. Toll 115 is non-contact tool, for instance an ion gun. Microbar's cylindrical surface 131 receives its processed surface through the movements of said tools. Tool 132 revolves (134) and moves in at least in one translational direction (133). In reference to FIG. 8, movement (133) is in the direction of x. However, direction y movement and any movement in x-y plane is instructive. Surface 135 of tool 132 is abrasive or cutting or other suitable selected articulated surface. Surface 153 need not necessarily be cylindrical.

Tool 115 scans in direction x and may be tangential to surface 131, that is, shooting from direction y. It may tilt in the x-y plane as needed. Beam 116 is ionic or light or x-ray or gamma ray or other suitable energy source suitable for milling or other processing as required.

Tool 137 does not turn but translates (138). Translation (138) is shown to be in direction x, but it may go in direction y too or in any direction in x-y plane thereof Tool 137 has a working surface or edge or tip 139 suitable for CMP or other processing.

Figure 14:
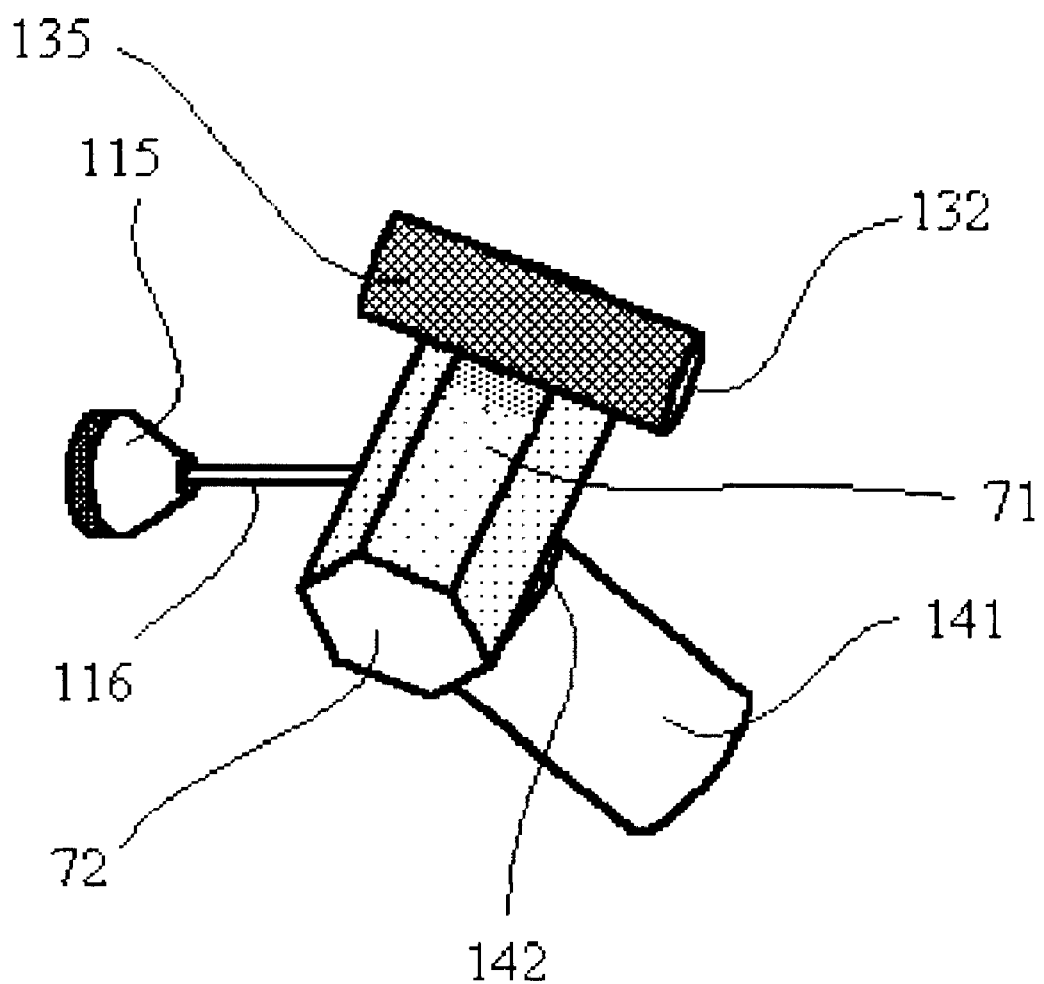
FIG. 14 illustrates a general mill process as applied to microbar making.

FIG.14 illustrates a general milling process modified to make microbars. This process is similar to the lathe process described above, thus will be explained just by a few references. Milling is mainly useful for prismatic microbar making.

Hex-microbar 72 is milled or polished by side cutter or polisher 132, which has a suitable rough or abrasive cylindrical surface 135 in contact with surface 71 of microbar 71. Face cutter or polisher 141 has contact with surface 71 on microbar 72 at its abrasive or otherwise enabled face 142. Ion gun 115 with ion beam 116 point to face 71. Rotational and translational movements of tools 115, 132 and 141 is not shown for clarity, but assumed to be instructive from the previous description of FIG. 13. Beam 116 may be lithographic coming through a mask covering one surface 71 at the time.

Figure 15:
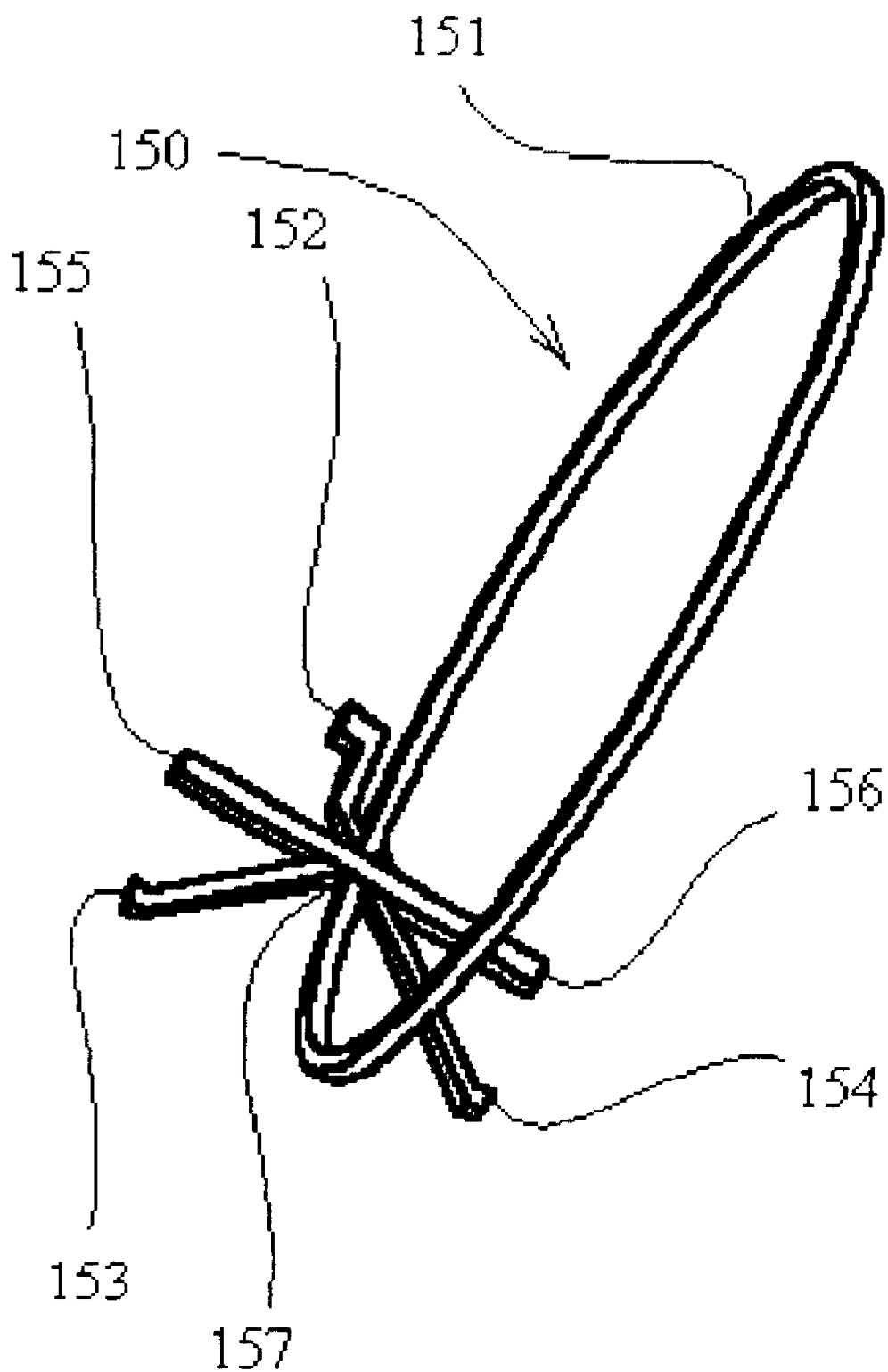
FIG. 15 illustrates a general-purpose photonic IC element.

FIG. 15 illustrates a general purpose photonic IC element or structure built onto the cylindrical surface of a microbar. It is useful for switching or routing or as a modulator or phase shifter, to mention a few. It is junction of dissimilar glasses formed in the trenches of an IC on a microbar using techniques disclosed above.

Switch 150 has an accelerator ring 151, which is fed by laser through inlet 152. Control branch 153 and inverse control 154 is melted into said ring and inlet. Main line 155–156 passes another laser light from end 155 to end 156. Said main line is a glass too and also melted into the previously described components across junction 157. Junction 157 can be a prism or lens as needed. A photonic IC contains a large network of similar optical paths. Terminals of optical pats may end in diodes or lasers for electronic control. Line 155–156 is in direction x in reference to FIG. 8. Other pathway may branch off in direction z in 3-D photonic circuits. Silicon is suitable for such electronic-photonic IC building. The microbar silicon can be polished or machined off from a solid ingot. Single crystal silicon can also be grown on the outer surface of a metallic pipe, which can serve as the hollow core of a photonic microbar.

Figure 16:
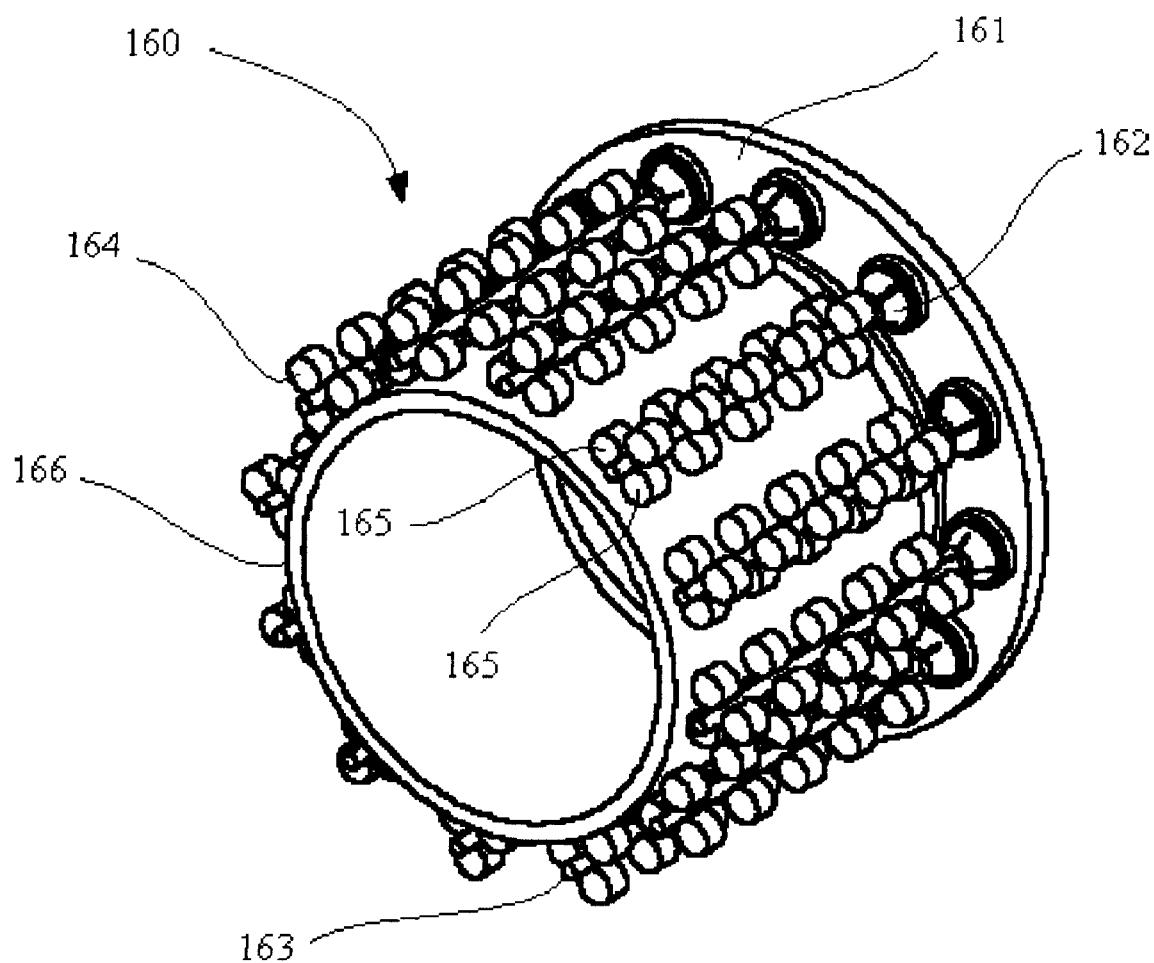
FIG. 16 illustrates a general-purpose tool suitable for microbar fabrication.

FIG. 16 illustrates a general-purpose tool—a multi head lathe—suitable for microbar fabrication. Chuck holder 161 holds multiplicity of chucks 162. Chuck 162 grips the microbar chord 163. Said chord is a long metallic pipe with silicon crystal grown on its outer surface. Another chuck (not shown) opposing said chuck 162 holds bar 163 under slight tension. Roller support said bar 163 during turning, polishing and other IC making processes as disclosed above. Rollers 164 are outer rollers, rolling inside rings (not shown for clarity). Rollers 165 support bar 163 from inside, rolling on pipe 166. Three rollers—one 164 and two 165s—define a support point alongside bar 163. Lathe process works between adjacent roller triads as described in FIG. 10 through 13. Once the microbars are ready, they will be cut from bar 163 between said roller triads. Movements of said chuck and rollers are not shown for clarity. In microchip making wafers travel between tools. In microbar making the microbar stays in a tool—such as tool 160—all the time. Sid tool retains its own microclimate, so there is no need for clean rooms. A fab making microbars may look just like any machine shop today.

The advantage of the multi chuck lathe is that is universal to all processes necessary in microbar making. That speeds up fabrication considerably. For instant, in one raw (163) ion implanting is done, while on another raw, polymer curing, both by scanning process in the same chuck (161). Wet and dry processes are to be separated however. The scanning process enhances said uniformity. Chuck (160)—about one half is shown—is about 12' diameter and 30" long, holding about 120 microbars concurrently. In that small space—tool heads require some extra space around—the IC output could be as high as the output today a quarter acre floor-plan fab facility. Material waste and environmental impact is minimal in such a microbar "fab" or tool.

To the skilled in semiconductor design and manufacturing, it shall be obvious that this invention is not limited to shown embodiments. Based on this teaching, rather instructive to derive other embodiments and applications, which fall within the microbar concept, but not shown and explained here for brevity and clarity.

What is claimed is:

1. An essentially bar shape semiconductor device, called "microbar", comprising at least one integrated electronic circuit on at least one of its surfaces.

2. An essentially bar shape semiconductor device, called "microbar", comprising at least one integrated photonic circuit on at least one of its surfaces.

3. Microbar of claim 1 comprising a counter bore at least on one of its end faces.

4. Microbar of claim 2 comprising a counter bore at least on one of its end faces.

5. Microbar of claim 1 comprising a through hole at its core.

6. Microbar of claim 2 comprising a through hole at its core.

7. Microbar of claim 1 comprising said circuit having at least one component of the group from transistor, diode, inductor, capacitor, coil, antenna, resistor, conductor, laser and liquid crystal.

8. Microbar of claim 2 comprising said circuit having at least one component of the group from photonic transistor, diode, coil, wave-guide, wave-splitter, switch, polarizer, channel filter, modulator, coupler, router, collector, spreader, lens and prism.

9. Microbar of claim 1 comprising solder bump leads separated by insulator from said circuit serving as input or output devices mounted at least in one surface of said bar.

10. Microbar of claim 2 comprising lenses connected to said circuit serving as fiber optic input-output devices mounted at least in one surface of said bar.

11. Microbar of claim 5 comprising conductive fluid flow through said hole.

12. Microbar of claim 6 comprising refractive fluid flow through said hole.

13. Microbar of claim 7 comprising at least one of said antenna of fractal geometry.

14. Microbar of claim 8 comprising at least one of said wave-guide of fractal geometry.

15. Microbar of claim 7 comprising at least one of said components activated by photonic component.

16. Microbar of claim 8 comprising at least one of said components activated by electronic component.

17. Microbar of claim 1 manufactured by using lathe or ion turning at least in one process.

18. Microbar of claim 2 manufactured by using lathe or ion turning at least in one process.

19. Microbar of claim 1 manufactured by using mill or ion milling at least in one process.

20. Microbar of claim 2 manufactured by using mill or ion milling at least in one process.

21. Microbar of claim 1 manufactured by using scanning lithography at least in one process, while said lathe is turning.

22. Microbar of claim 2 manufactured by using scanning lithography at least in one process, while said lathe is turning.

23. Microbar of claim 1 manufactured by using scanning vapor deposition at least in one process, while said lathe is turning.

24. Microbar of claim 2 manufactured by using scanning vapor deposition at least in one process, while said lathe is turning.

25. Microbar of claim 1 manufactured by using scanning doping at least in one process, while said lathe is turning.

26. Microbar of claim 2 manufactured by using scanning doping at least in one process, while said lathe is turning.

27. Microbar of claim 1 manufactured by using scanning sputtering or epitaxy at least in one process, while said lathe is turning.

28. Microbar of claim 2 manufactured by using scanning sputtering or epitaxy at least in one process, while said lathe is turning.

29. Microbar of claim 1 manufactured by using scanning etching at least in one process, while said lathe is turning.

30. Microbar of claim 2 manufactured by using scanning etching at least in one process, while said lathe is turning.

31. Microbar of claim 1 manufactured by using lathe for chemical mechanical polishing.

32. Microbar of claim 2 manufactured by using lathe for chemical mechanical polishing.

33. Microbar of claim 1 manufactured by using mill for chemical mechanical polishing.

34. Microbar of claim 2 manufactured by using mill for chemical mechanical polishing.

35. Microbar of claim 1 manufactured by using turning slot projection lithography.

36. Microbar of claim 2 manufactured by using turning slot projection lithography.

37. Microbar of claim 1 manufactured by using slot vapor deposition at least in one process, while said lathe is turning.

38. Microbar of claim 2 manufactured by using slot vapor deposition at least in one process, while said lathe is turning.

39. Microbar of claim 1 manufactured by using slot doping at least in one process, while said lathe is turning.

40. Microbar of claim 2 manufactured by using slot doping at least in one process, while said lathe is turning.

41. Microbar of claim 1 manufactured by using slot sputtering at least in one process, while said lathe is turning.

42. Microbar of claim 2 manufactured by using slot sputtering at least in one process, while said lathe is turning.

43. Microbar of claim 1 manufactured by using slot etching at least in one process, while said lathe is turning.

44. Microbar of claim 2 manufactured by using slot etching at least in one process, while said lathe is turning.

45. Microbar of claim 1 manufactured by using scanning ion implant at least in one process, while said lathe is turning.

46. Microbar of claim 2 manufactured by using scanning ion implant at least in one process, while said lathe is turning.

47. Microbar of claim 1 manufactured by using slot ion implant at least in one process, while said lathe is turning.

48. Microbar of claim 2 manufactured by using slot ion implant at least in one process, while said lathe is turning.

49. Microbar of claim 1 manufactured by using polymeric stamp etching at least in one process, while said lathe is turning.

50. Microbar of claim 2 manufactured by using polymeric stamp etching at least in one process, while said lathe is turning.

51. Microbar of claim 1 comprising a single crystal semiconductor substrate.

52. Microbar of claim 2 comprising a single photonic crystal substrate.

53. Microbar of claim 1 comprising a metal pipe core having on its outer surface a semiconductor layer formed by crystallization.

54. Microbar of claim 1 comprising a metal pipe core having on its outer surface a photonic layer formed by crystallization.

55. Microbar of claim 5 having on its outer surface at least one semiconductor crystalline layer formed by polymeric crystallization separated from said single crystal substrate by insulator layer.

56. Microbar of claim 6 having on its outer surface at least one photonic crystalline layer formed by polymeric crystallization separated from said single crystal substrate by dissimilar layer.

57. Microbar of claim 5 having said hole plugged at least at one end.

58. Microbar of claim 6 having said hole plugged at least at one end.

59. Microbar of claim 5 having said hole plugged at both end and holding fluid or gas within the thereby formed cavity.

60. Microbar of claim 6 having said hole plugged at both end and holding fluid or gas within the thereby formed cavity.

61. Microbar of claim 11 having said conductive-fluid through-flow used as heating or cooling medium either in manufacturing or in final use.

62. Microbar of claim 12 having said conductive-fluid through-flow used as heating or cooling medium either in manufacturing or in final use.

63. Microbar of claim 7 solely dedicated to one of the uses of radio frequency receiver or transmitter, resonator or shaker; electro magnet or magnetic cavity; single electron or photon or subatomic particle gun; electronic or photonic or nuclear sensor or receiver or counter; chemical or biological agent detector or identifier; capacitor or inductor; laser and computing or information storage.

64. Microbar of claim 8 comprising said circuit having at least one component of the group from cavity, trench, lattice, tube, bubble, lens, rod, ring, donut, coil made of dissimilar glasses.

* * * * *